United States Patent
Yu et al.

(10) Patent No.: US 7,495,472 B2
(45) Date of Patent: Feb. 24, 2009

(54) CIRCUITS/METHODS FOR ELECTRICALLY ISOLATING FUSES IN INTEGRATED CIRCUITS

(75) Inventors: Je-min Yu, Seoul (KR); Chi-wook Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 287 days.

(21) Appl. No.: 11/426,040

(22) Filed: Jun. 23, 2006

(65) Prior Publication Data

US 2007/0002659 A1    Jan. 4, 2007

(30) Foreign Application Priority Data

Jun. 25, 2005    (KR) .................. 10-2005-0055415

(51) Int. Cl.
*H03K 19/173* (2006.01)
(52) U.S. Cl. ..................... 326/38; 327/525
(58) Field of Classification Search ............ 326/37, 326/38, 46, 83; 327/524, 525
See application file for complete search history.

(56) References Cited

U.S. PATENT DOCUMENTS

| | | | |
|---|---|---|---|
| 5,345,110 A * | 9/1994 | Renfro et al. | 327/199 |
| 7,098,722 B2 * | 8/2006 | Shih et al. | 327/525 |
| 2003/0001589 A1 * | 1/2003 | Chan et al. | 324/550 |

FOREIGN PATENT DOCUMENTS

| | | |
|---|---|---|
| JP | 2003-152087 | 5/2003 |
| JP | 2003-157693 | 5/2003 |
| KR | 1020000011485 A | 2/2000 |
| KR | 1020020072915 A | 9/2002 |
| KR | 1020020090600 A | 12/2002 |

OTHER PUBLICATIONS

Notice to Submit Response in Korean Application No. 10-2005-0055415; date of mailing Aug. 31, 2006.
English translation of Notice to Submit Response in Korean Application No. 10-2005-0055415; date of mailing Aug. 31, 2006.

* cited by examiner

*Primary Examiner*—Don P Le
(74) *Attorney, Agent, or Firm*—Myers Bigel Sibley & Sajovec, P.A.

(57) ABSTRACT

A fuse circuit can include a cut-off unit circuit configured to electrically isolate a fuse from an input to a status information circuit after latching of status information associated with status of the fuse. Other fuse related circuits and methods are disclosed.

30 Claims, 5 Drawing Sheets

CIRCUITS/METHODS FOR ELECTRICALLY ISOLATING FUSES IN INTEGRATED CIRCUITS

CROSS-REFERENCE TO RELATED PATENT APPLICATION

This application claims the benefit of Korean Patent Application No. 10-2005-0055415, filed on Jun. 25, 2005, in the Korean Intellectual Property Office, the disclosure of which is incorporated herein in its entirety by reference.

FIELD OF THE INVENTION

The present invention relates to a semiconductor memory devices, and more particularly, to fuses in memory devices.

BACKGROUND

In general, a semiconductor memory device includes a redundancy circuit for repairing a defect on a semiconductor substrate or replacing a defective cell generated while the semiconductor memory device is fabricated with a redundancy cell. That is, the semiconductor memory device includes a redundancy memory cell array in addition to a memory cell array.

The semiconductor memory device including the redundancy memory cell array can include a plurality of fuse circuits in order to memorize each bits of the addresses indicating the memory cell array. When the memory cell array has a defective cell, the fuse circuits can be programmed such that fuses of the fuse circuits are cut in response to the address of the defective memory cell in a test process.

When a voltage for driving the semiconductor memory device is applied to the semiconductor memory device, the fuse circuits output fuse status information representing whether the fuses are cut. The fuses used in the semiconductor memory device can be made of a metal such as aluminum and copper, in general. The fuses can be cut by irradiating a laser thereon. Even when the fuses are cut, however, fuse remnants can remain, which may function as a resistor having a very large resistance value. The semiconductor memory device replaces defective memory cells with redundancy memory cells in response to the fuse status information.

FIG. 1 is a circuit diagram of a conventional fuse circuit 100, Referring to FIG. 1, the fuse circuit 100 includes a fuse 110, a status information output unit 130, and a holding and outputting unit 150. The conventional fuse circuit 100 is explained below on the assumption that the fuse 110 has been cut.

When a voltage for driving a semiconductor memory device is applied to the fuse circuit, a constant voltage signal PVCCH is set to a low level. The constant voltage signal PVCCH is generated by a constant voltage generator (not shown). The constant voltage signal generator includes a load having a large value. Accordingly, the constant voltage signal generator generates the constant voltage signal PVCCH which is gradually increased from a low level to a high level as the driving voltage is increased to a predetermined voltage level.

The constant voltage signal PVCCH set to a low level is inverted by a first inverter INV1 and inputted to the gate of a PMOS transistor P1 and the gate of a first NMOS transistor N1 such that the PMOS transistor P1 is turned off and the first NMOS transistor N1 is turned on. Accordingly, the status information output unit 130 outputs a low level signal to a node A.

The holding and outputting unit 150 outputs a fuse status information signal R_EN having a high level to a node B. The high level fuse status information signal R_EN is inputted to a second NMOS transistor N2 to turn on the second NMOS transistor N2.

As the driving voltage is applied and increased to the predetermined voltage level, the constant voltage signal PVCCH is gradually increased to a high level. The constant voltage signal increased to a high level is inverted by the first inverter INV1 and inputted to the gates of the PMOS transistor P1 and the first NMOS transistor N1 to turn on the PMOS transistor P1 and to turn off the first NMOS transistor N1.

The source of the PMOS transistor P1 is being floated because the fuse 110 has been cut. Accordingly, the node A and a node B are maintained at a low level and a high level, respectively, and the second NMOS transistor N2 is still turned on. Here, a current path having a large resistance value due to remnants of the cut fuse, that is, a current path consisting of a power supply voltage VDD, the fuse remnants, the PMOS transistor P1, the second NMOS transistor N2 and a ground voltage, is generated in the fuse circuit because both the PMOS transistor P1 and the second NMOS transistor N2 are turned on. This current path generates unnecessary leakage current to deteriorate power performance of the semiconductor memory device.

SUMMARY

Embodiments according to the invention can provide circuits/methods for electrically isolating fuses in integrated circuits. Pursuant to the embodiments, a fuse circuit can include a cut-off unit circuit configured to electrically isolate a fuse from an input to a status information circuit after latching of status information associated with status of the fuse.

In some embodiments according to the invention, the cut-off unit circuit is further configured to electrically connect the fuse to the input of the status information circuit during initialization of the status information associated with status of the fuse. In some embodiments according to the invention, a fuse circuit further includes a holding and outputting circuit configured to latch the status information associated with status of the fuse, wherein the holding and outputting circuit comprises a pair of cross-coupled inverters.

In some embodiments according to the invention, the fuse circuit further includes holding and outputting circuit configured to latch the status information associated with status of the fuse, wherein the holding and outputting circuit comprises an inverter cross-coupled with an output enabled inverter configured to be electrically isolated from a supply voltage during initialization of the status information associated with status of the fuse.

In some embodiments according to the invention, the output enabled inverter is further configured to be electrically connected to the supply voltage after initialization of the status information ends. In some embodiments according to the invention, the supply voltage is VDD or VSS.

In some embodiments according to the invention, a method of providing status information for a fuse in an integrated circuit device includes electrically connecting a fuse to an input of a status information circuit during initialization of status information associated status of the fuse and electrically isolating the fuse from the input to the status information circuit after latching of the status information associated with the status of the fuse.

In some embodiments according to the invention, the method further includes latching the status information associated with status of the fuse in a holding and outputting circuit. In some embodiments according to the invention, the method further includes electrically isolating the holding and outputting circuit from a supply voltage during initialization of the status information associated with status of the fuse.

DESCRIPTION OF EMBODIMENTS ACCORDING TO THE INVENTION

Figure 1:
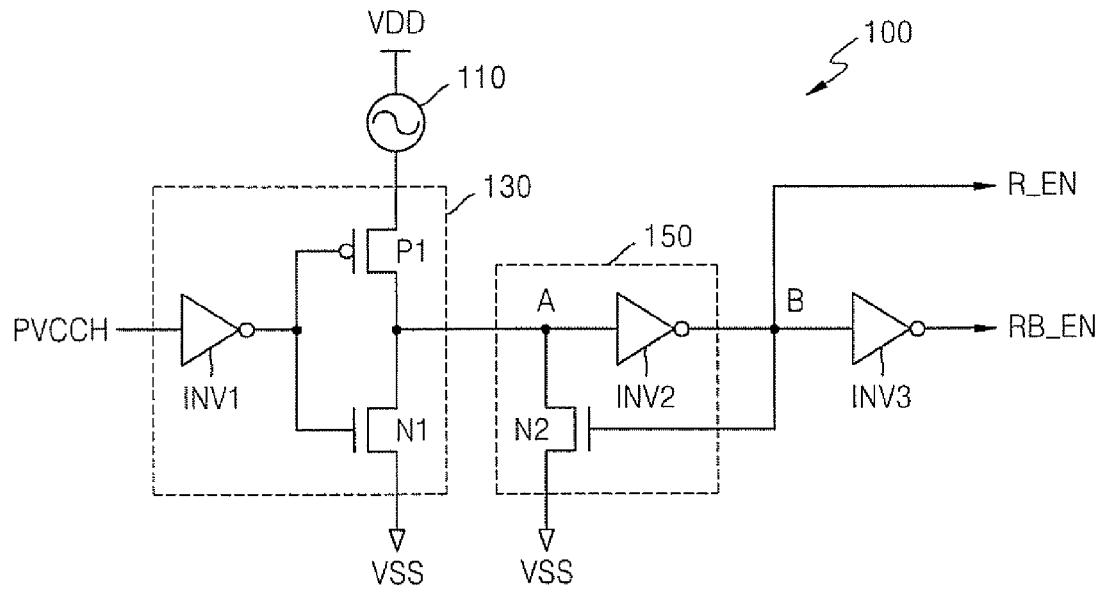
FIG. 1 is a circuit diagram of a conventional fuse circuit.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Fuse circuits according to some embodiments of the present invention cut off a leakage current path in response to a signal representing detection of the supply of a stable power supply voltage when fuse status information is initialized after a driving voltage is applied and the power supply voltage is stably supplied such that the fuse status information is output.

Embodiments of the present invention are described herein on the assumption that a fuse is cut because a current path caused by fuse remnants may not be as problematic when the fuse is not cut but the present invention is not limited thereto. It will be understood that the term "unit" is sometimes used herein to refer to a circuit.

Figure 2:
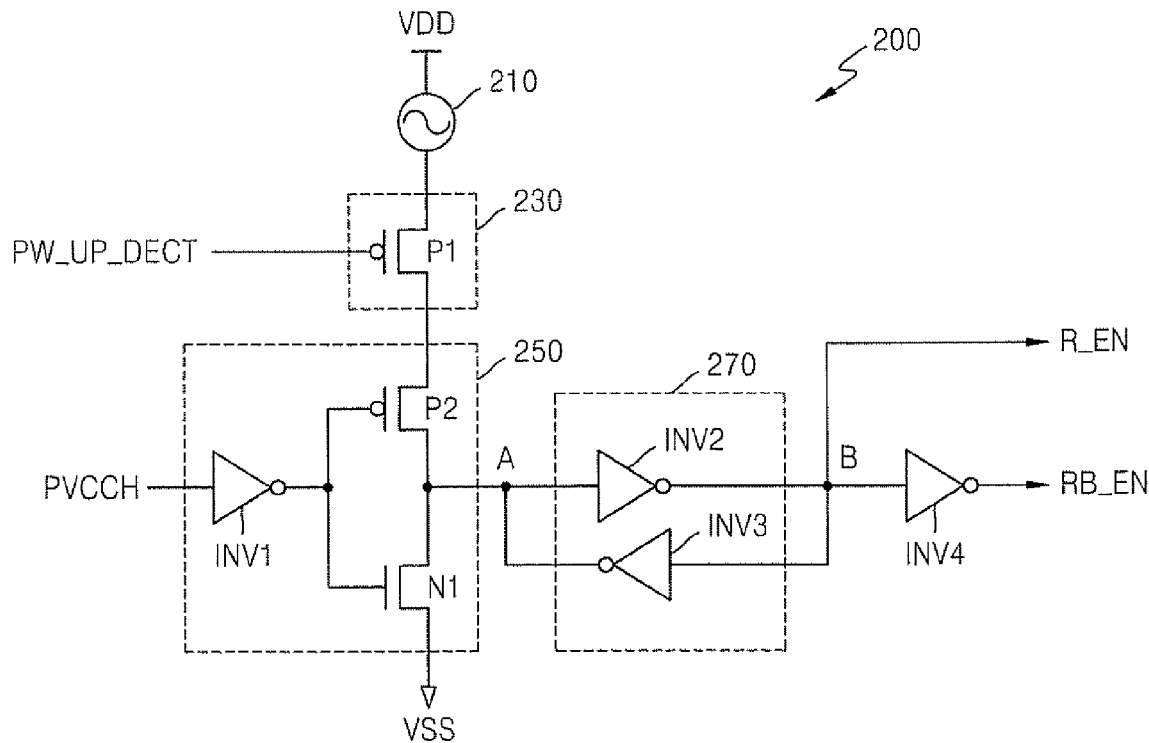
FIG. 2 is a circuit diagram of a fuse circuit according to a first embodiment of the present invention.

FIG. 2 is a circuit diagram of a fuse circuit 200 according to a first embodiment of the present invention. Referring to FIG. 2, the fuse circuit 200 includes a use 210, a cut-off unit 230, a status information output unit 250, and a holding and outputting unit 270.

The fuse 210 is coupled to a first voltage VDD and it can be cut to repair a defective cell of a memory cell array (not shown) included in a semiconductor memory device (not shown) including the use circuit 200. While the fuse 210 can be a laser fuse in this embodiment, the present invention is not limited thereto.

The status information output unit 250 outputs status information representing whether the fuse 210 is connected or cut to a first node A in response to a first control signal PVCCH. Preferably, the status information output unit 250 includes a first inverter INV1, a second MOS transistor P2, and a third MOS transistor N1.

The first inverter INV1 inverts the first control signal PVCCH. The first control signal PVCCH inverted by the first inverter INV1 is inputted to the gate of the second MOS transistor P2 which is serially coupled to a first MOS transistor P1. The first control signal inverted by the first inverter INV1 is also inputted to the gate of the third MOS transistor N1 which is serially connected between the second MOS transistor P2 and a second power supply voltage VSS. The status information is output to the first node A to which the second and third MOS transistors P2 and N1 are coupled.

The cut-off unit 230 cuts off the connection of the fuse 210 and the status information output unit 250 in response to a second control signal PW_UP_DECT whose logic level is varied with a variation in the level of the first control signal PVCCH. The cut-off unit 230 can include the first MOS transistor P1 having a gate receiving the second control signal PW_UP_DECT. The first MOS transistor P1 is serially connected between the fuse 210 and the status information output unit 250.

The first control signal PVCCH is set to a first level at the same time when a voltage for driving the semiconductor memory device (not shown) including the fuse circuit 200 is applied to the fuse circuit 200. The first control signal PVCCH is shifted from the first level to a second level as the driving voltage is increased to a predetermined voltage level (the power supply voltage level VDD, for example).

The second control signal PW_UP_DECT is set to the first level at the same time when the driving voltage is applied. The second control signal PW_UP_DECT is shifted to the second level in response to a third control signal detecting whether the first control signal PVCCH has been shifted to the second level.

In the first embodiment of the present invention, the third control signal is included in a command inputted from an external device. Preferably, the third control signal is generated by an external mode register set (EMRS) command.

The holding and outputting unit 270 holds the status information output to the first node A and outputs the held status information as fuse status information signal R_EN. That is, the holding and outputting unit 270 is a latch capable of storing data.

The holding and outputting unit 270 includes a second inverter INV2 and a third inverter INV3. The second inverter INV2 inverts the status information and outputs the inverted status information. The third inverter INV3 inverts the output signal of the second inverter INV2 and outputs the inverted signal to the first node A corresponding to the input port of the second inverter NV2.

A fourth inverter INV4 outputs the inverted fuse status information signal RB_EN required for replacing a defective cell (not shown) with a redundancy cell (not shown).

The operation of the fuse circuit 200 will now be explained with reference to FIG. 2. In the fuse circuit shown in FIG. 2, while a first power is the power supply voltage VDD, a second power is the ground voltage VSS, the first and second MOS transistors P1 and P2 are PMOS transistors, the third MOS transistor N1 is an NMOS transistor, the first level is a low level, and the second level is a high level, the present invention is not limited thereto.

When the driving voltage is applied to the fuse circuit 200, the first and second control signals PVCCH and PW_UP_DECT are set to the first level. The first MOS transistor P1 is turned on in response to the second control signal PW_UP_DECT set to a low level. The first control signal PVCCH set to a low level is inverted by the first inverter INV1 and inputted to the second and third MOS transistors P2 and N1, and thus the second MOS transistor P2 is turned off and the third MOS transistor N1 is turned on. Accordingly, the turned on third MOS transistor N1 outputs a low level signal to the first node A to initialize the status information.

As the driving voltage applied to the fuse circuit 200 is increased, the first control signal PVCCH is also increased from the low level to a high level. When the first control signal PVCCH is increased to the high level, the inverted first control signal having the low level is inputted to the gates of the second and third MOS transistors P2 and N1. Accordingly, the second MOS transistor P2 is turned on and the third MOS transistor N1 is turned off.

In this embodiment, the fuse 210 is considered to be cut off. Accordingly, the source of the first MOS transistor P1 is being floated and cut status information is transferred to the first node A through the first and second MOS transistors P1 and P2. That is, the cut status information is transferred to the first node A, and thus the status information at the first node A is maintained at a low level.

The holding and outputting unit 270 inverts the status information transferred to the first node A and outputs the inverted status information as the fuse status information signal R_EN. Furthermore, the holding and outputting unit 270 inverts the fuse status information signal R_EN and outputs the inverted fuse status information signal to the first node A to maintain the status information transferred to the first node A.

In this embodiment, the second control signal PW_UP_DECT represents whether the power supply voltage VDD has been increased to a predetermined voltage level. The second control signal PW_UP_DECT detects whether the first control signal PVCCH is increased to a high level in response to the third control signal. When the first control signal PVCCH is increased to a high level, the second control signal PW_UP_DECT is shifted to a high level.

The first MOS transistor P1 is turned off in response to the second control signal PW_UP_DECT shifted to a high level, and thus the fuse 230 is electrically cut off, Even when the fuse 230 is electrically cut off, the holding and outputting unit 270 outputs the fuse status information signal R_EN while maintaining the status information of the first node A. Accordingly, the fuse circuit 200 according to the first embodiment of the present invention can output the fuse status information signal R_EN and, simultaneously, turn off the first MOS transistor P1 to cut off a leakage current path generated due to fuse remnants.

As shown in FIG. 2, the holding and outputting unit 270 of the fuse circuit 200 is configured as a latch circuit including the first and second inverters INV2 and INV3. When the driving voltage is applied to the fuse circuit 200, the first node A should be initialized in response to the first control signal PVCCH. However, when the holding and outputting unit 270 is configured as a latch, a value stored in the latch can affect the first node A. Accordingly, there is a need for a fuse circuit that is not affected by the holding and outputting unit 270 when the first node A is initialized.

Figure 3:
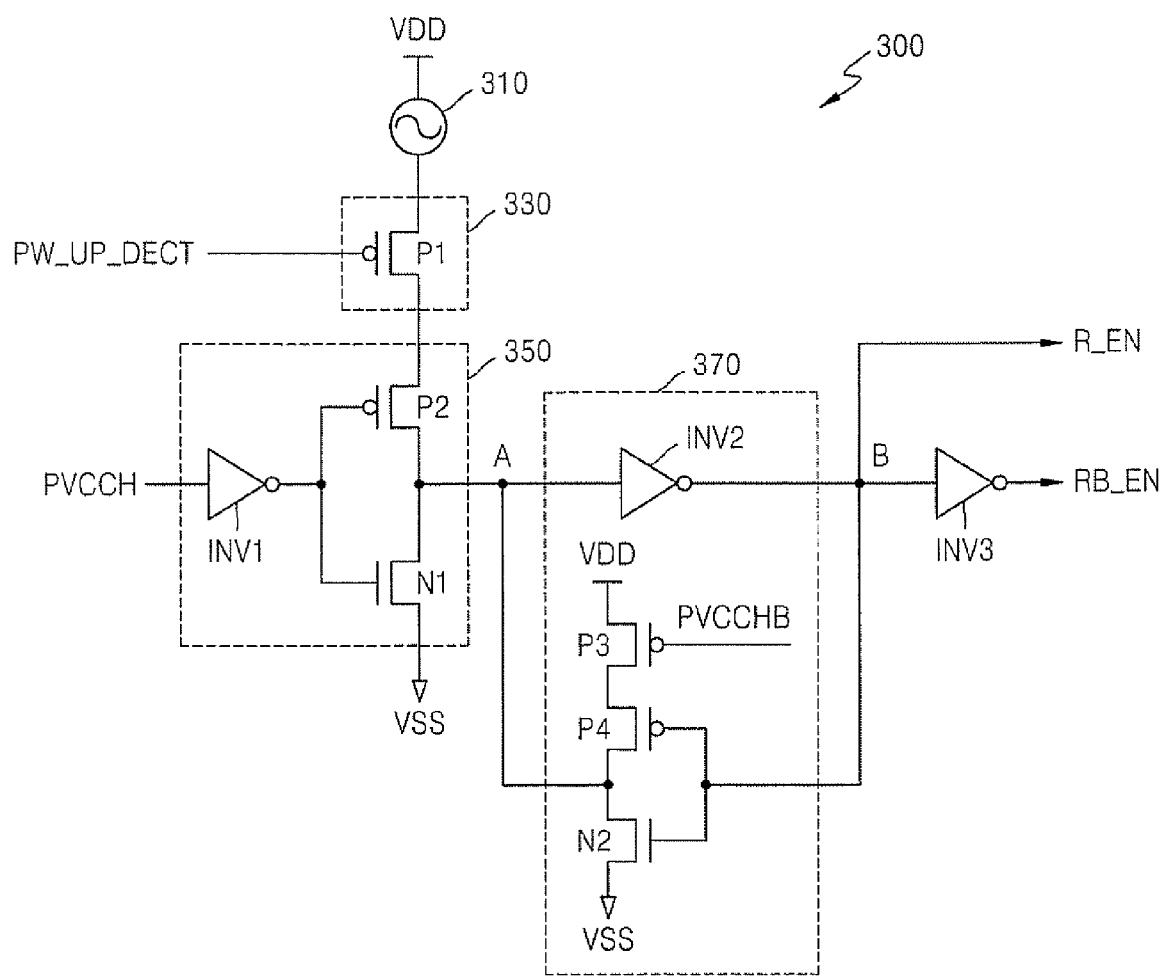
FIG. 3 is a circuit diagram of a fuse circuit according to a second embodiment of the present invention.

FIG. 3 is a circuit diagram of a fuse circuit 300 according to a second embodiment of the present invention. The fuse circuit 300 is constructed such that a value stored in the holding and outputting unit 270 does not affect the first node A when the first node A is initialized.

The fuse circuit 300 includes a fuse 310, a cut-off unit 330, a status information output unit 350, and a holding and outputting unit 370. The fuse circuit 300 has the same construction as the fuse circuit 200 of FIG. 2, except the holding and outputting unit 370. Thus, only the construction and operation of the holding and outputting unit 370 will now be explained.

The holding and outputting unit 370 includes a second inverter INV2, a fourth MOS transistor P3, a fifth MOS transistor P4, and a sixth MOS transistor N2. The second inverter INV2 inverts the status information and outputs the inverted status information. The inverted first control signal PVCCHB is inputted to the gate of the fourth MOS transistor P3 which is serially coupled to a third power. The output signal of the second inverter INV2 is inputted to the rate of the fifth MOS transistor P4 which is serially coupled to the fourth MOS transistor P3. The output signal of the second inverter INV2 is also inputted to the gate of the sixth MOS transistor N2 which is serially coupled between the fifth MOS transistor P4 and a fourth power VSS. The node to which the fifth MOS transistor P4 and the sixth MOS transistor N2 are coupled is connected to the first node A corresponding to the input port of the second inverter INV2.

The operation of the holding and outputting unit 370 will now be explained with reference to FIG. 3.

In the second embodiment of the present invention shown in FIG. 3, while the third power is a power supply voltage, the fourth power is a ground voltage VSS, the fourth and fifth MOS transistors P3 and P4 are PMOS transistors, and the sixth MOS transistor N2 is an NMOS transistor, the present invention is not limited thereto.

In the holding and outputting unit 370, the inverted first control signal PVCCHB is inputted to the fourth MOS transistor P3. Thus, the fourth MOS transistor P3 is turned off in response to the inverted first control signal PVCCHB which is set to a high level and inputted to the gate of the fourth MOS transistor P3 when the driving voltage is applied to the fuse circuit 300. Accordingly, the source of the fifth MOS transistor P4 is being floated and the first node A is not affected by the holding and outputting unit 370.

The first node A is initialized to a low level in response to the first control signal PVCCH set to a low level when the driving voltage is applied, and thus a second node B is set to a high level. The fifth MOS transistor P4 is turned off and the sixth MOS transistor N2 is turned on in response to the high level second node B and thus the first node A is continuously maintained at the initialized low level.

When the voltage level of the driving voltage is increased to a predetermined voltage level (the power supply voltage level VDD, for example), the first control signal PVCCH is also increased to a high level. Accordingly, the inverted first control signal PVCCH having a low level is inputted to the gates of the second and third MOS transistors P2 and N1 to turn on the second MOS transistor P2 and turn off the third MOS transistor N1. Here, the status information of the fuse 310 is transferred to the first node A through the first and second MOS transistors P1 and P2. Since the fuse has been cut in this embodiment, the source of the first MOS transistor P1 is being floated and thus the first node A is continuously maintained at a low level.

When the first control signal PVCCH is increased to a high level, the inverted first control signal PVCCHB having a low level is inputted to the gate of the fourth MOS transistor P3 to turn on the fourth MOS transistor P3. Accordingly, the inverted value of the value of the second node B is output to the first node A so that the holding and outputting unit 370 outputs the fuse status information signal R_EN having a high level while maintaining a constant value.

As described above, the fuse circuit 300 according to the second embodiment of the present invention initializes the first node A in response to the first control signal PVCCH without being affected by the holding and outputting unit 370.

Figure 4:
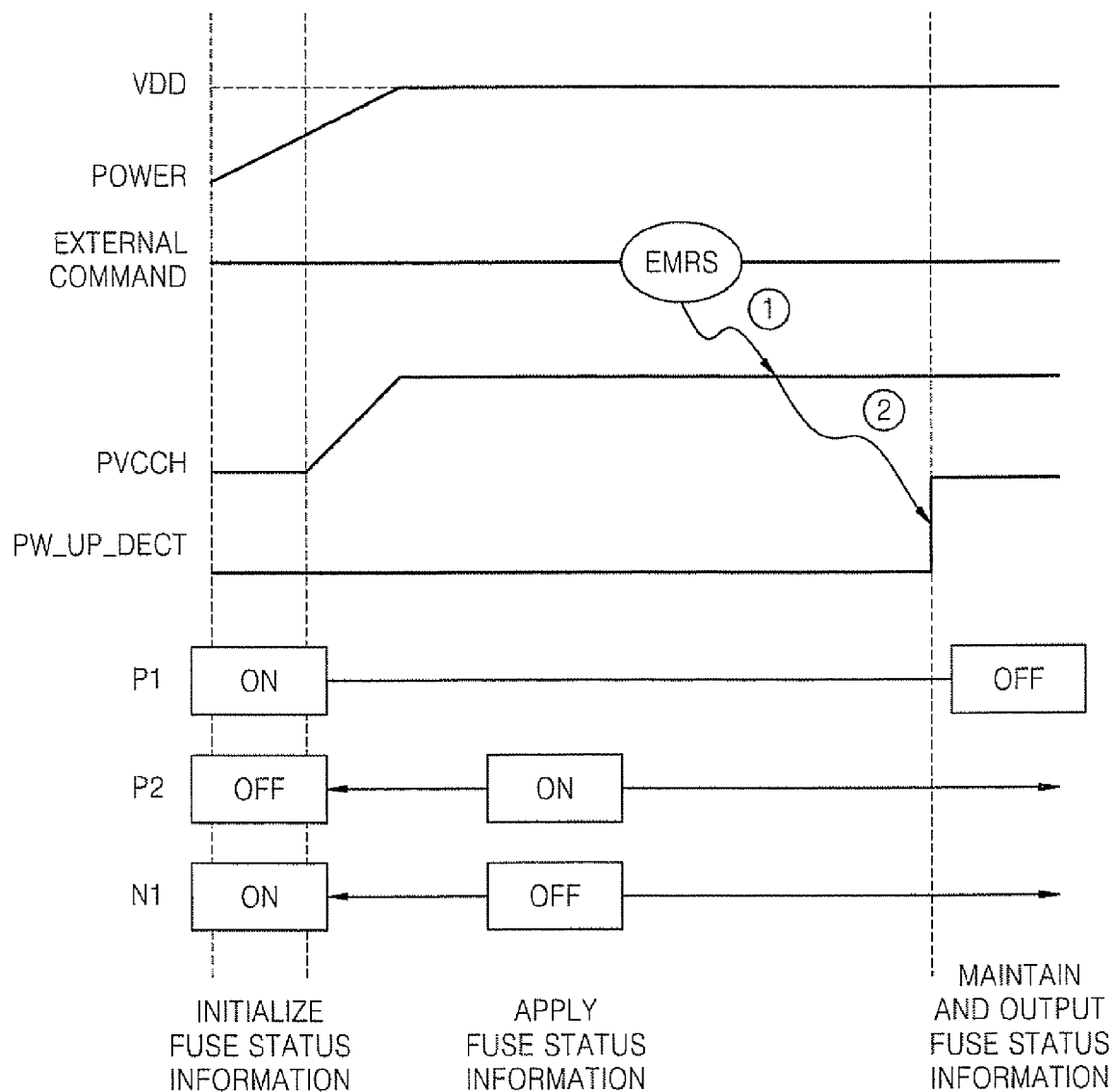
FIG. 4 is a timing diagram for explaining the operation of the fuse circuit according to the first embodiment of the present invention.

FIG. 4 is a timing diagram for explaining the operation of the fuse circuit according to the first embodiment of the present invention. Referring to FIG. 4, when the driving voltage is applied to the fuse circuit, the fuse circuit initializes the status information. Here, the first and second control signals PVCCH and PW_UP_DECT are set to the first level (a low level), and thus the first and third MOS transistors P1 and N1 are turned on and the second MOS transistor P2 is turned off.

As the driving voltage is increased to a predetermined voltage (the power supply voltage level VDD in the first embodiment of the present invention), the first control signal PVCCH is also increased to the second level (a high level) to transfer the status information. Here, the second MOS transistor P2 is turned on and the third MOS transistor N1 is turned off in response to the first control signal PVCCH having the second level. The status information is transferred to the first node A according to the turned on first and second MOS transistors P1 and P2.

As described above, the status information is applied after the driving voltage is increased to the predetermined voltage level (the power supply voltage level VDD in this embodiment of the invention) and the first control signal PVCCH is increased to the second level. When the operation of outputting the status information is completed, an external command is applied to the fuse circuit. The external command corresponds to a third control signal that detects whether the driving voltage has been increased to the predetermined voltage VDD. The third control signal can be generated by an external mode register set command.

The third control signal detects whether the first control signal PVCCH has been shifted from the first level to the second level. The second control signal PW_UP_DECT can be shifted to the second level in response to the third control signal. That is, when the first control signal PVCCH has been shifted from the first level to the second level, the second control signal PW_UP_DECT is shifted to the second level in response to the third signal. After the second control signal PW_UP_DECT has been shifted to the second level, fuse information is maintained and output. That is, the first MOS transistor P1 is turned off in response to the second control signal PW_UP_DECT having the second level, and thus a leakage current path that can be generated due to a cut fuse is cut off. In the meantime, the status information applied before the first MOS transistor P1 is turned off is output as the fuse status information signal R_EN while maintaining its value.

Figure 5:
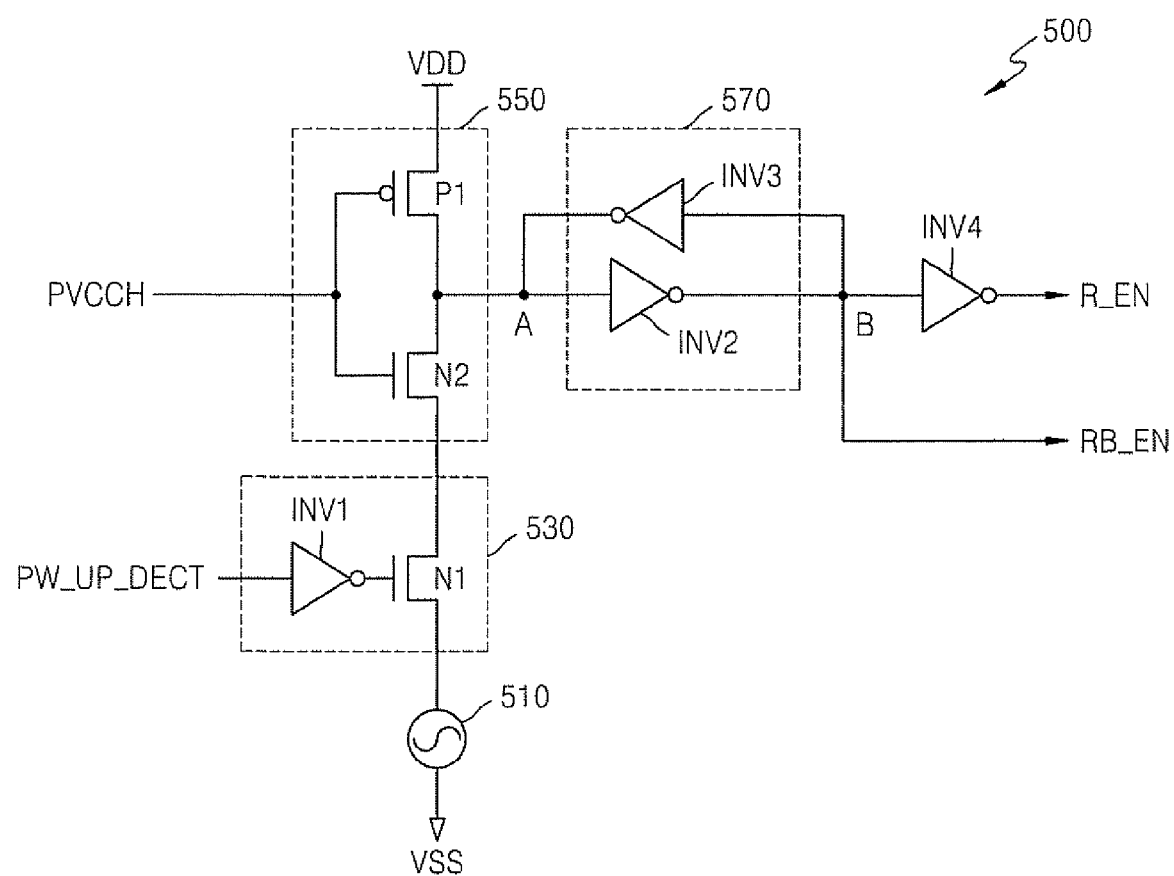
FIG. 5 is a circuit diagram of a fuse circuit according to a third embodiment of the present invention.

FIG. 5 is a circuit diagram of a fuse circuit 500 according to a third embodiment of the present invention. The fuse circuit 500 is an alternative of the fuse circuit 200 of FIG. 2 and it can use voltage levels and circuit elements replacing the corresponding voltage levels and circuit elements of the fuse circuit 200 of FIG. 2.

In the fuse circuit 500 of FIG. 5, a first voltage corresponds to a ground voltage, a second voltage corresponds to a power supply voltage, first and second MOS transistors N1 and N2 are NMOS transistors, and a third MOS transistor P1 is a PMOS transistor.

The characteristic construction and operation of the fuse circuit 500 will now be explained, which can be understood by those skill in the art with reference to the fuse circuit 200 of FIG. 2.

The fuse circuit 500 includes a fuse 510, a cut-off unit 530, a status information output unit 550, and a holding and outputting unit 570. The cut-off unit 530 includes a first inverter INV1 and a first MOS transistor N1. The first inverter INV1 inverts the second control signal PW_UP_DECT. The second control signal inverted by the first inverter INW1 is inputted to the gate of the first MOS transistor N1 which is serially connected between the fuse 510 and the status information output unit 550.

The status information output unit 550 includes second and third MOS transistors N2 and N3. The first control signal PVCCH is inputted to the gate of the second MOS transistor N2 which is serially connected to the first MOS transistor N1. The first control signal PVCCH is also inputted to the gate of a third MOS transistor P1 which is serially connected between the second MOS transistor N2 and the second power VDD. The status information is output to the node to which the second and third MOS transistors N2 and P1 are coupled.

A fourth inverter INV4 inverts the output signal of the holding and outputting unit 570 to output the fuse status information signal R_EN required for replacing a defective cell (not shown) with a redundancy cell (not shown).

The operation of the fuse circuit 500 will now be explained in detail with reference to FIG. 5.

When the driving voltage is applied to the fuse circuit 500, the first and second control signals PVCCH and PW_UP_DECT are set to a low level. Accordingly, the second control signal inverted by the first inverter INV1 to a high level is inputted to the gate of the first MOS transistor Ni to turn on the first MOS transistor N1.

The first control signal PVCCH set to a low level is inputted to the second and third MOS transistors N2 and P1 to turn on the second MOS transistor and turn off the third MOS transistor P1. Accordingly, a high level signal is output to the first node A according to the tuned on third MOS transistor P1 to initialize the status information. As the driving voltage is increased, the first control signal PVCCH is also increased from a low level to a high level. The first control signal PVCCH increased to a high level is inputted to the gates of the second and third MOS transistors N2 and P1, and thus the second MOS transistor N2 is turned on and the third MOS transistor P1 is turned off.

Since the fuse that can generate a leakage current path is considered to be cut off in the third embodiment of the present invention, the fuse 510 is being cut off Accordingly, the source of the first MOS transistor N1 is being floated and the cut status information is transferred to the first node A through the turned on first and second MOS transistors N1 and N2.

The holding and outputting unit 570 inverts the status information transferred to the first node A and outputs the inverted status information to the second node B. The fourth inverter INV4 outputs the value output to the second node B as the fuse status information signal R_EN. Furthermore, the holding and outputting unit 570 inverts the signal output to the second node B and outputs the inverted signal to the first node A to maintain the status information transferred to the first node A.

When it is detected whether the first control signal PVCCH has been increased to a high level in response to the third control signal and the second control signal PW_UP_DECT is shifted to a high level, the first MOS transistor N1 is turned off and thus the fuse 510 is electrically cut off.

Even when the fuse 510 is electrically cut off, the holding and outputting unit 570 outputs the fuse status information signal R_EN while maintaining the status information of the first node A.

Accordingly, the fuse circuit 500 according to the third embodiment of the present invention can output the fuse status information signal R_EN and, simultaneously, turn off the first MOS transistor N1 to cut off a leakage current path generated due to remnants of the cut fuse.

Figure 6:
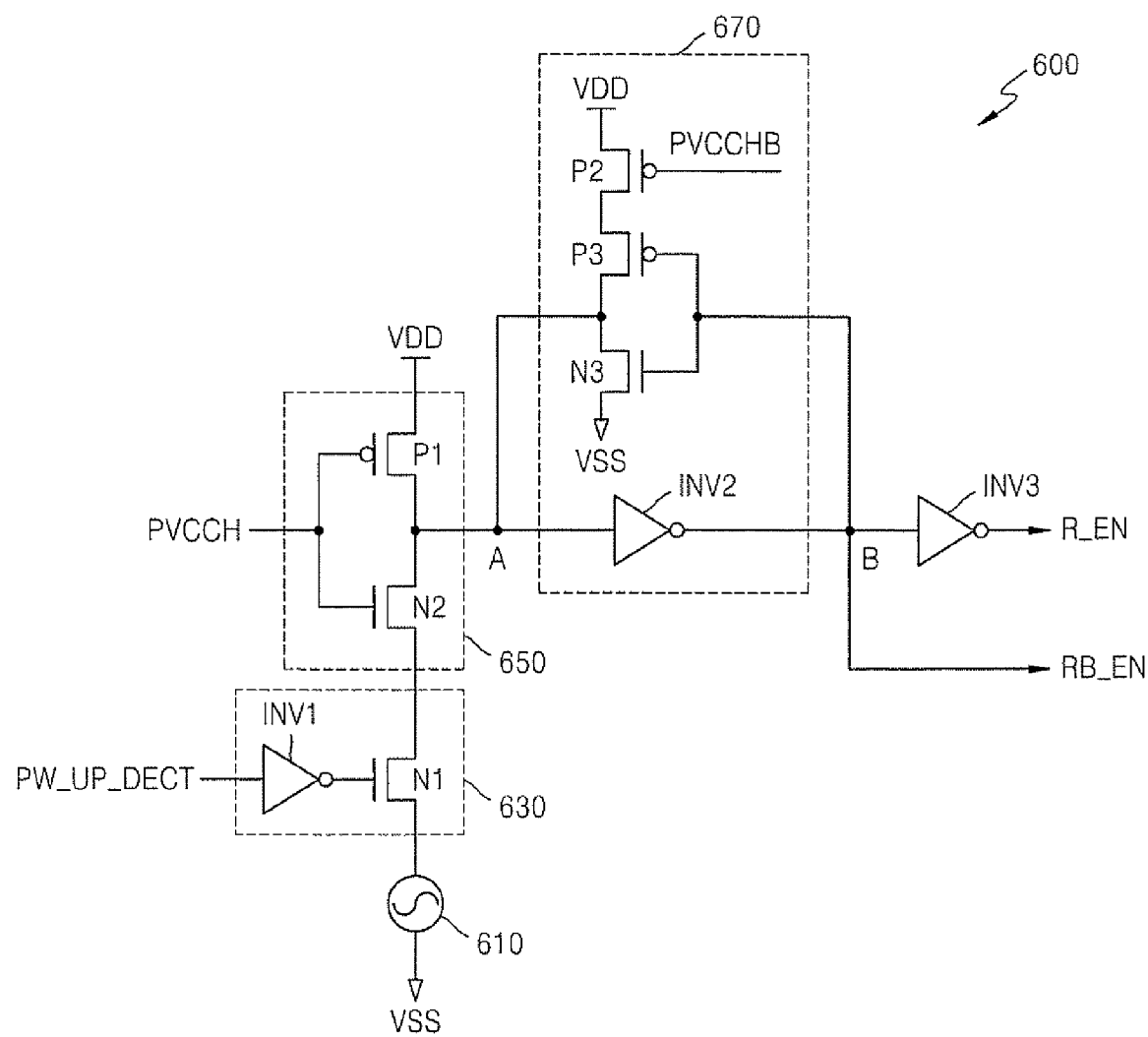
FIG. 6 is a circuit diagram of a fuse circuit according to a fourth embodiment of the present invention.

FIG. 6 is a circuit diagram of a fuse circuit 600 according to a fourth embodiment of the present invention. The fuse circuit 600 is an alternative of the fuse circuit 300 of FIG. 3. The holding and outputting unit 670 of FIG. 6 has the same construction as the holding and outputting unit 370 of FIG. 3. Furthermore, the constructions and operations of circuit components other than the holding and outputting unit 670 are identical to those of the fuse circuit 500 of FIG. 5. Accordingly, the operation of the fuse circuit 600 of FIG. 6 can be understood by those skill in the art with reference to FIGS. 3 and 5 so that detailed explanation therefore is omitted.

As described above, the fuse circuits according to the embodiments of the present invention can cut off a current path generated due to fuse remnants to prevent leakage current. Accordingly, a standby current problem can be improved to produce low power devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A fuse circuit comprising:
   a fuse connected to a first power supply;
   a status information output unit configured to output status information representing whether the fuse is connected or cut in response to a first control signal, the level of which varies responsive to variation of a driving voltage applied to a device including the fuse circuit;
   a cut-off unit configured to cut the connection of the fuse and the status information output unit in response to a second control signal having a logic level varying according to a level variation of the first control signal; and
   a holding and outputting unit configured to maintain the status information and output the maintained status information as a fuse status information signal.

2. The fuse circuit of claim 1, wherein the first control signal is set to a first level at the same time when the driving voltage is applied to the fuse circuit and shifted from the first level to a second level as the driving voltage is increased to a predetermined voltage level.

3. The fuse circuit of claim 2, wherein the first level is a low level and the second level is a high level.

4. The fuse circuit of claim 2, wherein the second control signal is set to the first level at the same time when the driving voltage is applied to the fuse circuit and shifted to the second level in response to a third control signal detecting whether the first control signal is shifted to the second level.

5. The fuse circuit of claim 4, wherein the third control signal is generated by an external mode register set command.

6. The fuse circuit of claim 1, wherein the cut-off unit includes a first MOS transistor having a gate receiving the second control signal, the first MOS transistor being serially connected between the fuse and the status information output unit.

7. The fuse circuit of claim 6, wherein the first power is a power supply voltage and the first MOS transistor is a PMOS transistor.

8. The fuse circuit of claim 7, wherein the status information output unit comprises:
   a first inverter inverting the first control signal;
   a second MOS transistor having a gate receiving the first control signal inverted by the first inverter, the second MOS transistor being serially connected to the first MOS transistor; and
   a third MOS transistor having a gate receiving the first control signal inverted by the first inverter, the third MOS transistor being serially connected to the second MOS transistor and a second power,
   wherein the status information is output to a node to which the second and third MOS transistors are connected.

9. The fuse circuit of claim 8, wherein the second power is a ground voltage, the second MOS transistor is a PMOS transistor, and the third MOS transistor is an NMOS transistor.

10. The fuse circuit of claim 8, wherein the holding and outputting unit is a latch circuit storing the status information.

11. The fuse circuit of claim 10, wherein the holding and outputting unit comprises:
    a second inverter inverting the status information and outputting the inverted status information; and
    a third inverter inverting the output of the second inverter and outputting the inverted output to the input port of the second inverter.

12. The fuse circuit of claim 10, wherein the holding and outputting unit comprises:
    the second inverter inverting the status information and outputting the inverted status information;
    a fourth MOS transistor having a gate receiving the inverted first control signal, the fourth MOS transistor being serially connected to a third power;
    a fifth MOS transistor having a gate receiving the output of the second inverter, the fifth MOS transistor being serially connected to the fourth MOS transistor; and
    a sixth MOS transistor having a gate receiving the output of the second inverter, the sixth MOS transistor being serially connected to the fifth MOS transistor and a fourth power,
    wherein a node to which the fifth and sixth MOS transistors are connected is coupled to the input port of the second inverter.

13. The fuse circuit of claim 12, wherein the third power is a power supply voltage, the fourth power is a ground voltage, the fourth and fifth MOS transistors are PMOS transistors, and the sixth MOS transistor is an NMOS transistor.

14. The fuse circuit of claim 1, wherein the cut-off unit comprises:
   a first inverter inverting the second control signal; and
   a first MOS transistor having a gate receiving the second control signal inverted by the first inverter, the first MOS transistor being serially connected between the fuse and the status information output unit.

15. The fuse circuit of claim 14, wherein the first power is a ground voltage and the first MOS transistor is an NMOS transistor.

16. The fuse circuit of claim 15, wherein the status information output unit comprises:
   a second MOS transistor having a gate receiving the first control signal, the second MOS transistor being serially connected to the first MOS transistor: and
   a third MOS transistor having a gate receiving the first control signal. the third MOS transistor being serially connected between the second MOS transistor and a second power,
   wherein the status information is output to a node to which the second and third MOS transistors are connected.

17. The fuse circuit of claim 16, wherein the second power is a power supply voltage, the second MOS transistor is an NMOS transistor, and the third MOS transistor is a PMOS transistor.

18. The fuse circuit of claim 16, wherein the holding and outputting unit is a latch circuit storing the status information.

19. The fuse circuit of claim 18, wherein the holding and outputting unit comprises:
   a second inverter inverting the status information and outputting the inverted status information; and
   a third inverter inverting the output of the second inverter and outputting the inverted output to the input port of the second inverter.

20. The fuse circuit of claim 18, wherein the holding and outputting unit comprises:
   the second inverter inverting the status information and outputting the inverted status information;
   a fourth MOS transistor having a gate receiving the inverted first control signal, the fourth MOS transistor being serially connected to a third power;
   a fifth MOS transistor having a gate receiving the output of the second inverter, the fifth MOS transistor being serially connected to the fourth MOS transistor; and
   a sixth MOS transistor having a gate receiving the output of the second inverter, the sixth MOS transistor being serially connected between the fifth MOS transistor and a fourth power,
   wherein a node to which the fifth and sixth MOS transistors are connected is coupled to the input port of the second inverter.

21. The fuse circuit of claim 20, wherein the third power is a power supply voltage, the fourth power is a ground voltage, the fourth and fifth MOS transistors are PMOS transistors, and the sixth MOS transistor is an NMOS transistor.

22. A fuse circuit comprising:
   a cut-off unit circuit configured to electrically isolate a fuse from an input to a status information circuit after latching of status information associated with status of the fuse, wherein the status information circuit outputs an indication of whether the fuse is connected or cut in response to a first control signal the level of which varies responsive to variation of a driving voltage applied to a device including the fuse circuit.

23. A fuse circuit according to claim 22 wherein the cut-off unit circuit is further configured to electrically connect the fuse to the input of the status information circuit during initialization of the status information associated with status of the fuse.

24. A fuse circuit according to claim 23 further comprising:
   a holding and outputting circuit configured to latch the status information associated with status of the fuse, wherein the holding and outputting circuit comprises a pair of cross-coupled inverters.

25. A fuse circuit according to claim 23 further comprising:
   a holding and outputting circuit configured to latch the status information associated with status of the fuse, wherein the holding and outputting circuit comprises an inverter cross-coupled with an output enabled inverter configured to be electrically isolated from a supply voltage during initialization of the status information associated with status of the fuse.

26. A fuse circuit according to claim 25 wherein the output enabled inverter is further configured to be electrically connected to the supply voltage after initialization of the status information ends.

27. A fuse circuit according to claim 25 wherein the supply voltage comprises VDD or VSS.

28. A method of providing status information for a fuse in an integrated circuit device, comprising:
   electrically connecting a fuse to an input of a status information circuit during initialization of status information associated status of the fuse; and
   electrically isolating the fuse from the input to the status information circuit after latching of the status information associated with the status of the fuse, wherein the status information circuit outputs an indication of whether the fuse is connected or cut in response to a first control signal the level of which varies responsive to variation of a driving voltage applied to a device including the fuse.

29. A method according to claim 28 further comprising:
   latching the status information associated with status of the fuse in a holding and outputting circuit.

30. A method according to claim 29 further comprising:
   electrically isolating the holding and outputting circuit from a supply voltage during initialization of the status information associated with status of the fuse.

* * * * *